United States Patent

[11] 3,631,349

[72] Inventor Dong Woo Rhee
Williamsville, N.Y.
[21] Appl. No. 17,442
[22] Filed Mar. 9, 1970
[45] Patented Dec. 28, 1971
[73] Assignee Sylvania Electric Products Inc.

[54] AUTOMATIC SIGNAL-SEEKING CIRCUITRY
16 Claims, 1 Drawing Fig.

[52] U.S. Cl. .......... 325/470, 325/422, 334/15, 325/344
[51] Int. Cl. .......... H04b 1/32
[50] Field of Search .......... 325/469, 470, 332, 335, 336, 422; 334/11, 13, 15, 16

[56] References Cited

UNITED STATES PATENTS 3,325,737 6/1967 Berman .......... 325/470
3,384,826 5/1968 Schurig .......... 325/422
3,467,870 9/1969 Aoyama .......... 325/470

*Primary Examiner*—Robert L. Griffin
*Assistant Examiner*—R. S. Bell
*Attorneys*—Norman J. O'Malley, Robert E. Walrath and Thomas H. Buffton

ABSTRACT: An FM receiver having a source of detected signals and a voltage-responsive tuner includes signal-seeking apparatus having a charging circuit coupled to the source of detected signals, connectable to a potential source by a switching device, and coupled to the voltage-responsive tuner by a potential follower means whereby a varying potential accumulated in the charging circuit is applied to the voltage-responsive tuner until a received signal is detected whereupon the application of the varying potential to the voltage-responsive tuner is automatically discontinued.

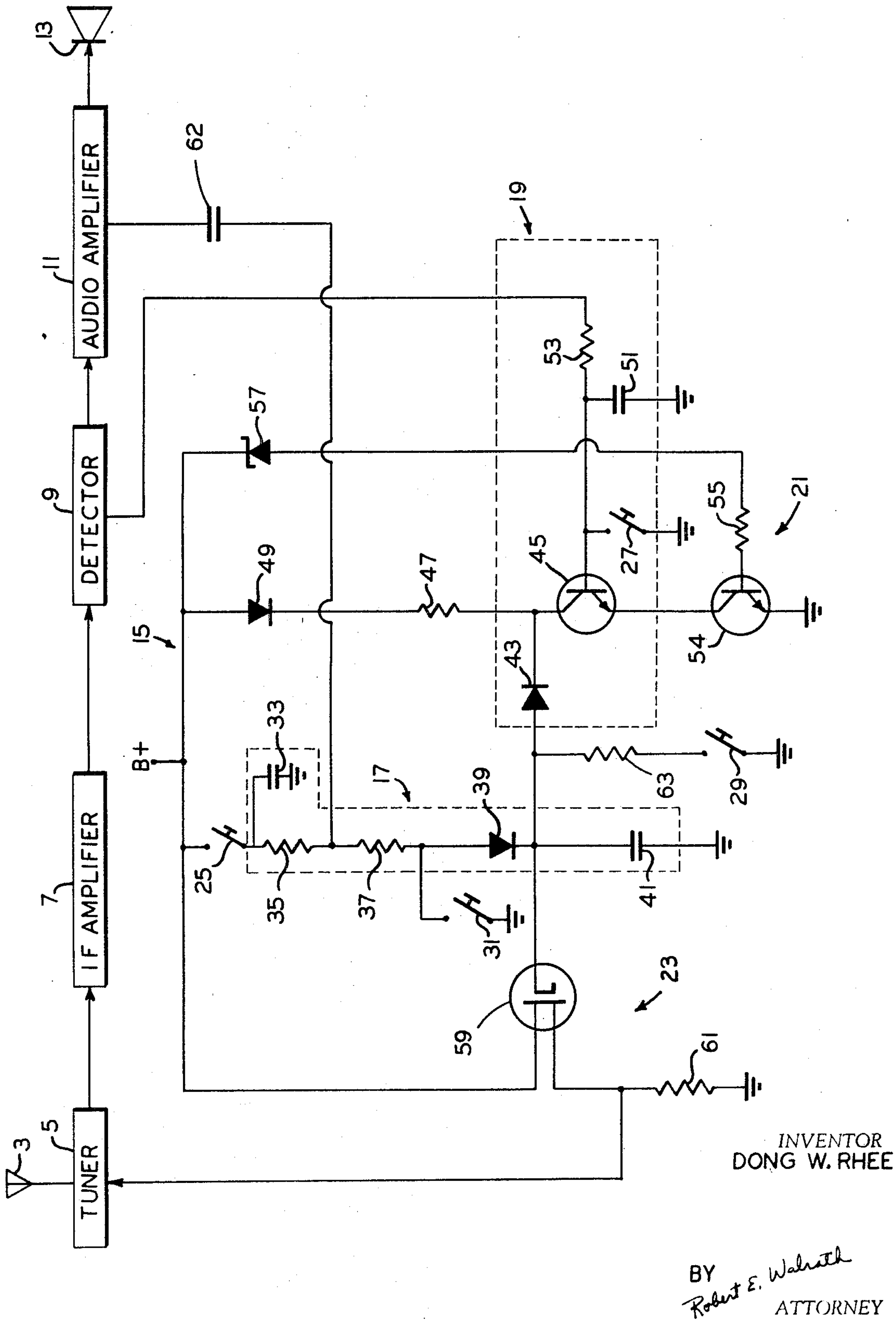
INVENTOR
DONG W. RHEE
BY Robert E. Walrath
ATTORNEY

AUTOMATIC SIGNAL-SEEKING CIRCUITRY

BACKGROUND OF THE INVENTION

Generally, known forms of automatic signal-seeking apparatus are, for the most part, mechanical in nature employing a series of relays and motors to effect rotation or movement of a switch-type tuner. Also, the relays and motors are responsive to a received signal to automatically effect discontinuance of the rotation or movement of the tuner.

With the advent of the varicap diode whereby variations in applied potential serve to effect variations in capacity and frequency, an improved electronic form of signal tuning is achievable. However, varicap tuning systems require a very stable DC voltage source if undesired frequency drift is to be avoided. Thus, automatic frequency control (AFC) circuitry has been developed and is employed to inhibit the above-mentioned undesired drift in frequency.

Another one of the problems associated with known forms of varicap tuning systems, including those employing an AFC system, is the loss of station tuning whenever the signal fades as the power applied to the receiver is temporarily lost. Still another problem associated with some of the known varicap tuning systems is the lack of the feature of station memory whereby the station tuning remains unchanged even though the receiver is turned off or disabled for a period of time.

OBJECTS AND SUMMARY OF THE INVENTION

An object of the present invention is to provide an enhanced signal-seeking system for frequency-modulated (FM) signal-receiving apparatus. Another object of the invention is to provide a signal-seeking system capable of searching in both directions for a signal of either increased or decreased frequency. Still another object of the invention is to provide a varicap signal-seeking system having a memory or storage capability. A further object of the invention is to provide an enhanced varicap signal-seeking system wherein loss of station tuning due to fading or power loss is inhibited.

These and other objects, advantages and capabilities are achieved in one aspect of the invention by signal-seeking apparatus having a charging circuit coupled by a switching device to a power source, to a detected signal source, and via a potential follower means to a varicap tuner in an FM receiver.

BRIEF DESCRIPTION OF THE DRAWINGS

The sole FIGURE is an illustration, in block and schematic form, of a preferred form of signal-seeking apparatus.

DESCRIPTION OF THE PREFERRED EMBODIMENT

For a better understanding of the present invention, together with other and further objects, advantages and capabilities thereof, reference is made to the following disclosure and appended claims in conjunction with the accompanying drawing. For purposes of discussion, but in no way limiting the invention, a frequency-modulated (FM) receiver will be employed to illustrate the embodiment. Obviously, a system such as a television receiver employing detected video signals rather than detected audio signals is equally suitable to the invention or as a vehicle for discussion.

Referring to the drawing, a frequency-modulated (FM) signal receiver includes the usual antenna 3 for intercepting transmitted signals and applying the intercepted signals to a tuner 5. The tuner 5 includes RF amplifier, oscillator and mixer stages wherein a signal at an intermediate frequency (IF) is derived and applied to an IF amplifier stage 7. In turn, signals from the IF amplifier stage 7 are applied to a detector stage 9 wherein audio signals are developed and applied via an audio amplifier stage 11 to a loudspeaker 13.

Also, signals available from the detector stage 9 are coupled back to the tuner 5 which is of the varicap diode variety responsive to variations in potential to effect variations in tuning. Moreover, these feedback signals from the detector stage 9 and the audio amplifier stage 11 are applied to the tuner 5 by way of signal-seeking circuitry 15. The signal seeking circuitry 15 includes a potential source B+, a charging circuit 17, a potential coupling means 19, a switching means 21, and a potential follower means 23. Also included in the circuitry 15 is a first pair of switching devices 25 and 27 and a second pair of switching devices 29 and 31.

The charging circuit 17 includes a charge capacitor 33 coupled to the potential source B+ via one of the first pair of switching devices 25 and to a potential reference level such as circuit ground. In parallel connection with the charge capacitor 33, intermediate the switching device 25 and circuit ground, is a series-connected pair of resistors 35 and 37, a first unidirectional conduction device 39, and a memory capacitor 41.

DC coupling the charging circuit 17 to the detector stage 9 is a potential coupling means 19. The potential-coupling means 19 includes a second unidirectional conduction device 43, coupled to the junction of the first unidirectional conductor device 39 and memory capacitor 41, and an amplifier 45 in the form of a transistor having a collector electrode coupled to the second unidirectional conduction device 43 and via a series-connected resistor 47 and third unidirectional conduction device 49 to the potential source B+. The control electrode of the transistor amplifier 45 is coupleable via a second one of the first pair of switching devices 27 to a potential reference level. Also, the control electrode of the amplifier 45 is coupled via a capacitor 51 to circuit ground, and via a resistor 53 to the detector stage 9. The emitter of the amplifier 45 is coupled to the switching means 21 which is, in turn, coupled to circuit ground.

The switching means 21 includes a transistor 54 having a collector electrode coupled to the amplifier 45 of the potential-coupling means 19 and an emitter electrode coupled to a potential reference level or circuit ground. The control electrode of the transistor 54 is coupled via a series resistor 55 and threshold-type device such as a zener diode 57 or a neon lamp to the potential source B+. Preferably, the zener diode 57 has a breakdown voltage in the range of about 75 percent of the value of the potential source B+ whereby a 25 percent change in the potential source B+ causes deactivation of the switching means 21 and the system.

A high-input, impedance-type transistor 59, such as a metallized oxide silicon field effect transistor (MOSFET) for instance, has a gate electrode coupled to the charging circuit 17 and a drain electrode coupled to the potential source B+. The source electrode of the (MOSFET) transistor is coupled via an impedance 61 to circuit ground and to the tuner 5.

Additionally, the junction of the series-connected resistors 35 and 37 is connected, via a capacitor 62, to the audio amplifier stage 11. Moreover, one of the second pair of switching devices 29 couples the junction of the charging circuit 17 and potential-coupling means 19, via a resistor 63, to circuit ground while the other one 31 of the second pair of switching devices couples the junction of the series-connected resistor 37 and first unidirectional conduction device 39 to circuit ground.

In operation, signal seeking is effected by momentary closing of the first pair of switches 25 and 27 whereupon a charge is developed on the charge capacitor 33 from the potential source B+. This charge from the charge capacitor 33 slowly charges the memory capacitor 41 by way of the series-connected resistors 35 and 37 and the forward-biased first diode 39.

This increasing potential appearing at the memory capacitor 41 is applied by way of the potential follower means 23 to the varicap-type tuner 5 which responds to increasing potential to cause a reduction in capacity and, in turn, tunes the system to a higher frequency. Thus, the above-mentioned signal search action continues until a signal is approached causing development of an output signal from the detector stage 9. Averaging this output signal from the detector stage 9 with a simple low-pass RC filter causes development of the well-known automatic frequency control (AFC) potential.

This AFC potential developed from the output signal of the detector stage 9 is applied to the control electrode of the amplifier 45 of the potential-coupling means 19. Since the transistor 54 of the switching means 21 is always in a saturated conduction condition due to the base current applied via the zener diode 57 and resistor 55, the DC amplifier 45 will conduct when this applied AFC potential exceeds the threshold voltage (at about 0.3 volts) of the DC amplifier 45. Thus, the AFC potential is amplified in the vicinity of about 200 times by the DC amplifier 45 and the voltage at the collector electrode of the amplifier 45 is reduced from the potential of the potential source B+ to a value slightly lower than the charge voltage of the memory capacitor 41. This reduction in potential forward biases the second unidirectional conduction device 43 providing a path for current drain from the memory capacitor 41 through the DC amplifier 45 and switching means transistor 54 to circuit ground.

In essence, a negative feedback loop is developed which includes the series-connected memory capacitor 41, the potential-following means 23, the tuner 5, the IF amplifier 7, the detector 9, the DC amplifier 45, and the second unidirectional conduction device 43. Therein, an increase in charge at the memory capacitor 41 causes the application of an increased potential to the tuner 5, via the follower means 23, which increases the signals and potentials from the tuner 5, IF amplifier 7, and detector 9. The increased potential from the detector 9 causes conduction of the DC amplifier 45 reducing the potential at the collector electrode thereof which forward bias the conduction device 43 providing the drain path for the charge of the memory capacitor 41.

Thus, the charge available from the memory capacitor 41 is maintained substantially constant by the above-mentioned negative feedback loop and the potential applied to the tuner 5, as well as the station tuning remains substantially unchanged. In other words, the AFC system locks onto the selected station and applies varying incremental potentials to the DC amplifier 45 which alternately allows conduction and nonconduction of the second unidirectional conduction device 43 and discharge of the memory capacitor 41 to compensate for slight drifting of frequency locking the tuner 5 to the selected station.

As to internal leakage of the memory capacitor 41 and follower means 23, an auxiliary DC potential source is provided for compensation. Herein, a small amount of audio signal available from the audio amplifier stage 11 is applied to the junction of the series-connected resistors 35 and 37. This applied audio signal is rectified by the first unidirectional conduction device 39 and applied to the memory capacitor 41. Thus, the above-described drift-correcting circuitry provides compensation for any charge loss of the memory capacitor 41 due to internal leakage thereof or of the follower means 23 by rectification of a portion of the audio signal.

As to station fade, it is to be noted that station fade is obviously accompanied by a lack of audio signal suitable for rectification and a lack of AFC potential from the detector stage 9. Since there us no audio signal for rectification, there is no signal-developed potential available from the audio amplifier stage 11 for application via the unidirectional conduction device 39 to the memory capacitor 41.

Also, the lack of an AFC potential from the detector stage 9 for application to the base electrode of the DC amplifier 45 causes the collector voltage of the amplifier 45 to approach the value of the potential source B+. As a result, the unidirectional conduction device 43 is reverse biased and the drain path for the memory capacitor 41 is interrupted. Thus, the potential of the memory capacitor 41 remains substantially constant during a station fade period and the entire system returns to the previously described normal operation when the signal reappears.

It should be further noted that interruption or discontinuance of the potential source B+ does not result in station loss. When the potential source B+ is interrupted, intentionally or unintentionally, the drain paths from the memory capacitor 41 via the follower means 23 and the transistors 45 and 54 are automatically disconnected.

More specifically, a reduction in the potential from the potential source B+ below the threshold level of the zener diode 57 causes opening thereof. Usually, a reduction of about 25 percent in potential from the potential source B+ opens the diode 57 removing the forward bias potential applied to the transistor 54 of the switching means 21. Thereupon, the transistor 54 and transistor 45 are rendered nonconductive opening the drain path of the capacitor 41 through the amplifier 45.

Thus, it can be seen that interruption of the potential course B+ is accompanied by little or no effect upon the tuning of the signal-seeking system. Also, it will be observed that purposeful interruption of the potential source B+ does not cause a shift in tuning of the receiver since the memory capacitor 41 is of a type such that the charge thereon will remain for long periods of time when the drain paths therefrom are essentially open circuited.

Additionally, it should be noted that a down voltage mode of operation for returning the tuning system to a lower point in the tuning range is essentially a switching operation. Herein, the second pair of switching devices 29 and 31, as well as the first pair of switching devices 25 and 27, are momentarily closed. Thereupon, the potential of the charge capacitor 41 is essentially decreased by a drain path to circuit ground through the resistor 63 and switch 29 and the potential applied to the tuner 5 via the potential follower means 23 is continually decreased. Returning the closed switching devices 25 and 27 and 29 and 31 to an open position causes a return to the originally described up-mode type of operation.

Thus, there has been provided a unique signal-seeking system having numerous advantages over prior known systems. The apparatus is not only economical of components which greatly reduces the cost but also overcomes such undesirable deficiencies as station shift due to fade and to potential source interruption. Moreover, the apparatus includes a memory feature wherein the station tuning remains unchanged even though the apparatus is rendered inoperative for relatively long periods of time.

While there has been shown and described what is at present considered the preferred embodiment of the invention, it will be obvious to those skilled in the art that various changes and modifications may be made therein without departing from the scope of the invention as defined by the appended claims.

I claim:

1. In frequency-modulated (FM) signal-receiving apparatus having a voltage-responsive tuner and a detected signal source responsive to signals from the tuner, a signal-seeking system comprising:

a potential source;

charging circuit means including a memory capacitor;

potential follower means coupling said memory capacitor of said charging circuit means to said voltage-responsive tuner;

potential coupling means for amplifying a signal from said detected signal source and applying a said amplified signal to said memory capacitor of said charging circuit means;

a first pair of switching devices to effect an increasing frequency mode of said tuner by coupling said potential source to said charging circuit means and said potential-coupling means to a potential reference level to cause charging of said memory capacitor and upon receipt of a signal by said tuner decoupling said potential source from said charging circuit means and said potential-coupling means from said potential reference level whereby said potential-coupling means provides a drain path for said memory capacitor; and a second pair of switching devices for effecting a decreasing frequency mode of said tuner by selectively coupling and decoupling said memory capacitor of said charging circuit means and a potential reference level.

2. The signal-seeking system of claim 1 including a switching means coupled to said potential source and intermediate said potential-coupling means and a potential reference level whereby a reduction in potential from said potential source causes operation of said switching means opening the drain path of said memory capacitor whereupon the potential applied to said tuner remains substantially constant.

3. The signal-seeking system of claim 1 wherein said charging circuit means includes a charge capacitor in parallel connection with said memory capacitor intermediate one of said first pair of switching devices and a potential reference level.

4. The signal-seeking system of claim 1 wherein said charging circuit means includes a charge capacitor coupling one of said first pair of switching devices to a potential reference level and a series-connected impedance, unidirectional conduction device, and said memory capacitor in parallel connection with said charge capacitor.

5. The signal seeking system of claim 1 wherein said potential-coupling means includes a series-connected DC amplifier stage and unidirectional conduction device connected intermediate said detected signal source and said charging circuit means.

6. The signal-seeking system of claim 1 including an audio amplifier stage coupled to said detected signal source and responsive thereto for providing and applying an audio signal to said charging circuit means whereby rectified audio signals are applied to said memory capacitor to compensate for leakage thereof.

7. The signal-seeking system of claim 1 wherein said first pair of switching devices are ganged.

8. The signal-seeking system of claim 1 wherein said second pair of switching devices are ganged.

9. The signal-seeking system of claim 1 wherein said potential follower means is in the form of a high-input impedance electron device having a first electrode coupled to said potential source, a second electrode coupled to a potential reference level and to said voltage-responsive tuner, and a third electrode coupled to said charging circuit means.

10. The signal-seeking system of claim 2 including a threshold device coupling said switching means to said potential source.

11. In an FM signal receiver having a voltage-responsive tuner and a detector signal source, a signal-seeking system comprising in combination:

a potential source;

charging circuit means including a charging capacitor connected to a potential reference level and a series-connected unidirectional conduction device and memory capacitor coupled in parallel with said charging capacitor;

potential follower means coupling said memory capacitor of said charging circuit means to said voltage-responsive tuner;

potential-coupling means including a series-connected amplifier stage and unidirectional conduction device DC coupling said detector signal source to said memory capacitor of said charging circuit means;

audio amplifier means coupled to said detector signal source and AC coupled to said unidirectional conduction device of said charging circuit means;

a first pair of switching devices for effecting an increased frequency mode of said tuner by coupling said potential source to said charging circuit means and said potential-coupling means to a potential reference level to effect increased charging of said memory capacitor and upon interception of a signal by said tuner decoupling said potential source from said potential source and said potential-coupling means from said potential reference level; and a second pair of switching devices for effecting a decreasing mode of said tuner by selectively coupling and decoupling said memory capacitor of said charging circuit means to a potential reference level.

12. The signal-seeking system of claim 11 including a unidirectional conduction device coupling said amplifier stage of said potential-coupling means to said potential source.

13. The signal-seeking system of claim 11 wherein said potential follower means is in the form of a metallized oxide silicon field effect transistor (MOSFET).

14. The signal-seeking system of claim 11 wherein said FM signal receiver is in the form of a television receiver and said detector signal source is in the form of an IF picture carrier detector signal source.

15. The signal-seeking system of claim 11 including a switching means coupled to said potential source and coupling said potential-coupling means to a potential reference level.

16. The signal-seeking system of claim 15 including a threshold device coupling said switching means to said potential source.

* * * * *